United States Patent
Danialy et al.

(10) Patent No.: US 10,520,550 B2
(45) Date of Patent: Dec. 31, 2019

(54) RECONFIGURABLE SCAN NETWORK DEFECT DIAGNOSIS

(71) Applicant: Mentor Graphics Corporation, Wilsonville, OR (US)

(72) Inventors: Givargis Avareh Danialy, San Jose, CA (US); Martin Keim, Sherwood, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 36 days.

(21) Appl. No.: 15/985,679

(22) Filed: May 21, 2018

(65) Prior Publication Data

US 2018/0335475 A1 Nov. 22, 2018

Related U.S. Application Data (60) Provisional application No. 62/509,556, filed on May 22, 2017.

(51) Int. Cl.
*G01R 31/3177* (2006.01)
*G01R 31/317* (2006.01)
*G01R 31/3185* (2006.01)

(52) U.S. Cl.
CPC ... *G01R 31/3177* (2013.01); *G01R 31/31712* (2013.01); *G01R 31/31855* (2013.01); *G01R 31/318566* (2013.01)

(58) Field of Classification Search
CPC .......... G01R 31/3177; G01R 31/31855; G01R 31/318566; G01R 31/31712
See application file for complete search history.

(56) References Cited

U.S. PATENT DOCUMENTS

| | | | | |
|---|---|---|---|---|
| 7,954,022 B2* | 5/2011 | Chakraborty | .. | G01R 31/318558 714/726 |
| 8,726,108 B2* | 5/2014 | Tekumalla | ..... | G01R 31/318558 714/726 |
| 2003/0200492 A1* | 10/2003 | Nakao | ............ | G01R 31/318547 714/724 |
| 2006/0248423 A1* | 11/2006 | Swaminathan | .. | G01R 31/31813 714/738 |
| 2008/0215943 A1* | 9/2008 | Guo | ............... | G01R 31/318544 714/729 |

(Continued)

OTHER PUBLICATIONS

M. A. Kochte, R. Baranowski, M. Schaal and H. Wunderlich, "Test Strategies for Reconfigurable Scan Networks," 2016 IEEE 25th Asian Test Symposium (ATS), Hiroshima, 2016, pp. 113-118. (Year: 2016).*

(Continued)

*Primary Examiner* — Cynthia Britt (57) ABSTRACT

A reconfigurable scan network in a circuit is configured such that a first scan path is used if a programmable component has no stuck-at fault and a second scan path is used if the programmable component has a stuck-at fault. A test pattern having a length equal to a length of the second path is shifted into the reconfigurable scan network, and a part or a whole of the test pattern is then shifted out from the reconfigurable scan network. The part or the whole of the test pattern being shifted out is analyzed to determine whether the programmable component has the stuck-at fault.

15 Claims, 5 Drawing Sheets

Flow chart 300

(56) References Cited

U.S. PATENT DOCUMENTS

| | | | | |
|---|---|---|---|---|
| 2009/0235134 A1* | 9/2009 | Guo | .............. | G01R 31/318544 714/726 |
| 2010/0017760 A1* | 1/2010 | Kapur | ............ | G01R 31/318583 716/132 |
| 2010/0218061 A1* | 8/2010 | Sinanoglu | ...... | G01R 31/318547 714/731 |
| 2011/0083195 A1* | 4/2011 | Crouch | .......... | G01R 31/318558 726/27 |
| 2014/0208175 A1* | 7/2014 | Kumar | .......... | G01R 31/318536 714/727 |
| 2014/0372821 A1* | 12/2014 | Rajski | ............ | G01R 31/318547 714/727 |

OTHER PUBLICATIONS

H. Dounavi and Y. Tsiatouhas, "Stuck-at fault diagnosis in scan chains," 2014 9th IEEE International Conference on Design & Technology of Integrated Systems in Nanoscale Era (DTIS), Santorini, 2014, pp. 1-6. (Year: 2014).*

X. Chen and M. S. Hsiao, "An Overlapping Scan Architecture for Reducing Both Test Time and Test Power by Pipelining Fault Detection," in IEEE Transactions on Very Large Scale Integration (VLSI) Systems, vol. 15, No. 4, pp. 404-412, Apr. 2007. (Year: 2007).*

R. Cantoro et. al., "On the Testability of IEEE 1687 Networks", 2015 IEEE 24th Asian Test Symposium.

* cited by examiner

Flow chart 300

RECONFIGURABLE SCAN NETWORK DEFECT DIAGNOSIS

RELATED APPLICATIONS

This application claims the benefit of U.S. Provisional Patent Application No. 62/509,556, filed on May 22, 2017, titled "Automatic Diagnosis Of IJTAG Networks," and naming Givargis Avareh Danialy et al. as inventors, which application is incorporated entirely herein by reference.

FIELD OF THE DISCLOSED TECHNIQUES

The presently disclosed techniques relates to circuit testing and defect diagnosis. Various implementations of the disclosed techniques may be particularly useful for diagnosing reconfigurable scan network defects.

BACKGROUND OF THE DISCLOSED TECHNIQUES

The number of functional blocks in semiconductor devices continues to increase significantly as the integration of functionality into a single semiconductor device continues. A functional block may be a sensor for temperature or voltage, a clock controlling circuitry like programmable clock dividers (PLL), scan configuration controllers, or entire Built-In Self-Test (BIST) engines for memory or logic testing. Accessing, controlling, observing, or in more general terms "operating", a large number of these functional blocks presents a challenge to designers.

Figure 2:
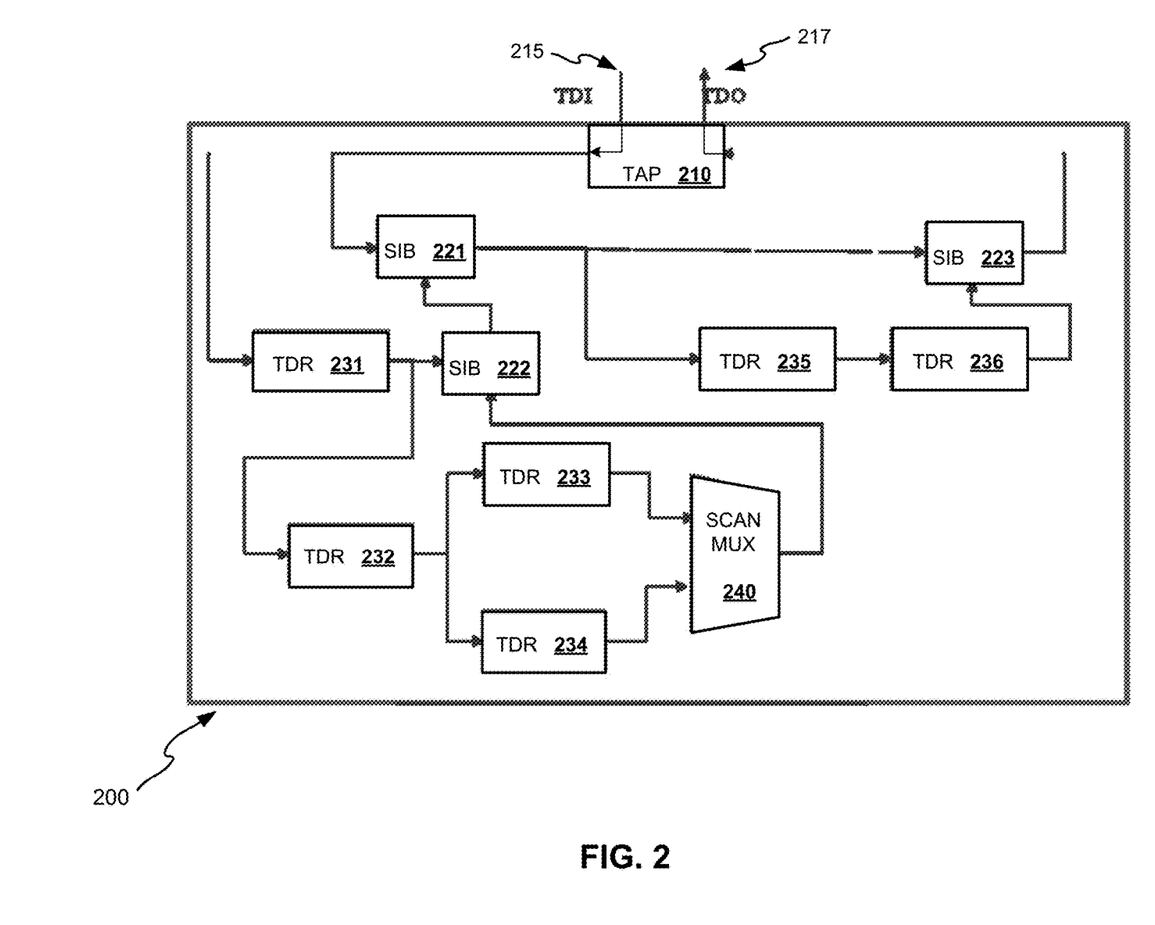
FIG. 2 illustrates an example of a reconfigurable scan network 200 conforming to IEEE 1687-2014 (IJTAG).

Traditionally, functional blocks are daisy-chained in a single, serial access network. This leads to numerous scan operations for shifting data bits into and out from these functional blocks. To reduce the access time, reconfigurable scan networks such as those conforming to IEEE 1687-2014 and IEEE 1149.1-2013 are employed to replace the traditional serial access networks. Based on certain programming operations of special elements of the access network, parts of a reconfigurable scan network can go in and out of the scan path. FIG. 2 illustrates an example of a reconfigurable scan network 200 conforming to IEEE 1687-2014 (IJTAG). In this IJTAG network 200, a SIB (Segment Insertion Bit) 223 switches between two different access paths between a TDI (Test Data In) port 215 and a TDO (Test Data Out) port 217, which both belong to a TAP (Test Access Port) 210. The shorter access path directly connects the SIB 223 to a SIB 221 while the longer access path connects the SIB 223 to the SIB 221 through two TDRs (Test Data Registers) 235 and 236. In a similar way, a ScanMux (multiplexer) 240 combines two scan segments of the access network 200 and can select either one based on control data received.

As FIG. 2 shows, programmable components of a reconfigurable scan network such as the SIBs 221-223 and the ScanMux 240 in the scan network 200 allow the dynamic configuration of the access network to bring a specific functional block into the scope of the access network. These programmable components can be programmed by shifting configuration data into the shift flip-flops of the control register in them and latching the shifted bits into the parallel latches. The functional blocks of the circuit are controlled by the TDRs 231-236. This dynamic access network configuration minimizes the number of shift operations needed for operating the desired functional block(s). Additional advantages of such reconfigurable scan networks are derived from the ability to configure the access network according to power and clock domains. For example, placing a SIB in front of a power domain allows the part of the access network outside of this power domain remains operational when the power domain is switched off. In a similar way, hierarchical design entities can be taken in and out of the scope of the access network, enabling the bypass of every functional object within the respective design hierarchy entity.

Due to the increasing size and complexity of the reconfigurable scan network, it becomes likely that the reconfigurable scan network contains one or several manufacturing defects. This can cause a variety of erroneous behavior. For example a SIB may no longer switch between the different network branches, or a certain TDR bit is stuck at 1. Manufacturing tests will detect such defective networks, e.g. by failing to access the desired functional objects. However, such manufacturing tests will only reveal that the access network is broken. In order to understand which objects of the access network are (potentially) defective and what their respective defective behavior might be, additional, specific tests and diagnosis are needed.

BRIEF SUMMARY OF THE DISCLOSED TECHNIQUES

Various aspects of the disclosed technology relate to techniques for diagnosing defective programmable components of a reconfigurable scan network. In one aspect, there is a method, executed by at least one processor of a computer, comprising: generating configuration data for configuring a reconfigurable scan network in a circuit such that a first scan path is used if a programmable component has no stuck-at fault and a second scan path is used if the programmable component has a stuck-at fault, the first scan path and the second scan path sharing a same scan path segment after the programmable component; and generating a test pattern having a length equal to a length of the second path for being shifting into and out from the reconfigurable scan network configured by the configuration data, wherein a part or a whole of the test pattern being shifted out is analyzed to determine whether the programmable component has the stuck-at fault, the analyzing comprises: determining whether the part or the whole of the test pattern is shifted out at clock cycles expected for the second scan path.

The reconfigurable scan network may conform to IEEE 1687-2014 (IJTAG). The programmable component defect suspect may be a SIB or a ScanMux.

The first scan path and the second scan path may be selected such that the same scan path segment after the programmable component has a shortest length. The programmable components of the reconfigurable scan network other than the programmable component defect suspect may be programmed to allow a shorter scan path segment to be selected for each of the programmable components.

In another aspect, there are one or more non-transitory computer-readable media storing computer-executable instructions for causing one or more processors to perform the above method.

In still another aspect, there is a method, comprising: configuring a reconfigurable scan network in a circuit such that a first scan path is used if a programmable component has no stuck-at fault and a second scan path is used if the programmable component has a stuck-at fault, the first scan path and the second scan path sharing a same scan path segment after the programmable component; shifting a test pattern having a length equal to a length of the second path into the reconfigurable scan network; shifting out a part or a whole of the test pattern from the reconfigurable scan network; and analyzing the part or the whole of the test pattern being shifted out to determine whether the programmable component has the stuck-at fault, the analyzing comprises: determining whether the part or the whole of the test pattern is shifted out at clock cycles expected for the second scan path.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed techniques. Thus, for example, those skilled in the art will recognize that the disclose techniques may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNIQUES

General Considerations

Various aspects of the disclosed technology relate to techniques for diagnosing defective programmable components of a reconfigurable scan network. In the following description, numerous details are set forth for the purpose of explanation. However, one of ordinary skill in the art will realize that the disclosed technology may be practiced without the use of these specific details. In other instances, well-known features have not been described in details to avoid obscuring the disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

The detailed description of a method or a device sometimes uses terms like "configure" and "analyze" to describe the disclosed method or the device function/structure. Such terms are high-level descriptions. The actual operations or functions/structures that correspond to these terms will vary depending on the particular implementation and are readily discernible by one of ordinary skill in the art.

Additionally, as used herein, the term "design" is intended to encompass data describing an entire integrated circuit device. This term also is intended to encompass a smaller group of data describing one or more components of an entire device such as a portion of an integrated circuit device nevertheless.

Illustrative Computing Environment

Figure 1:
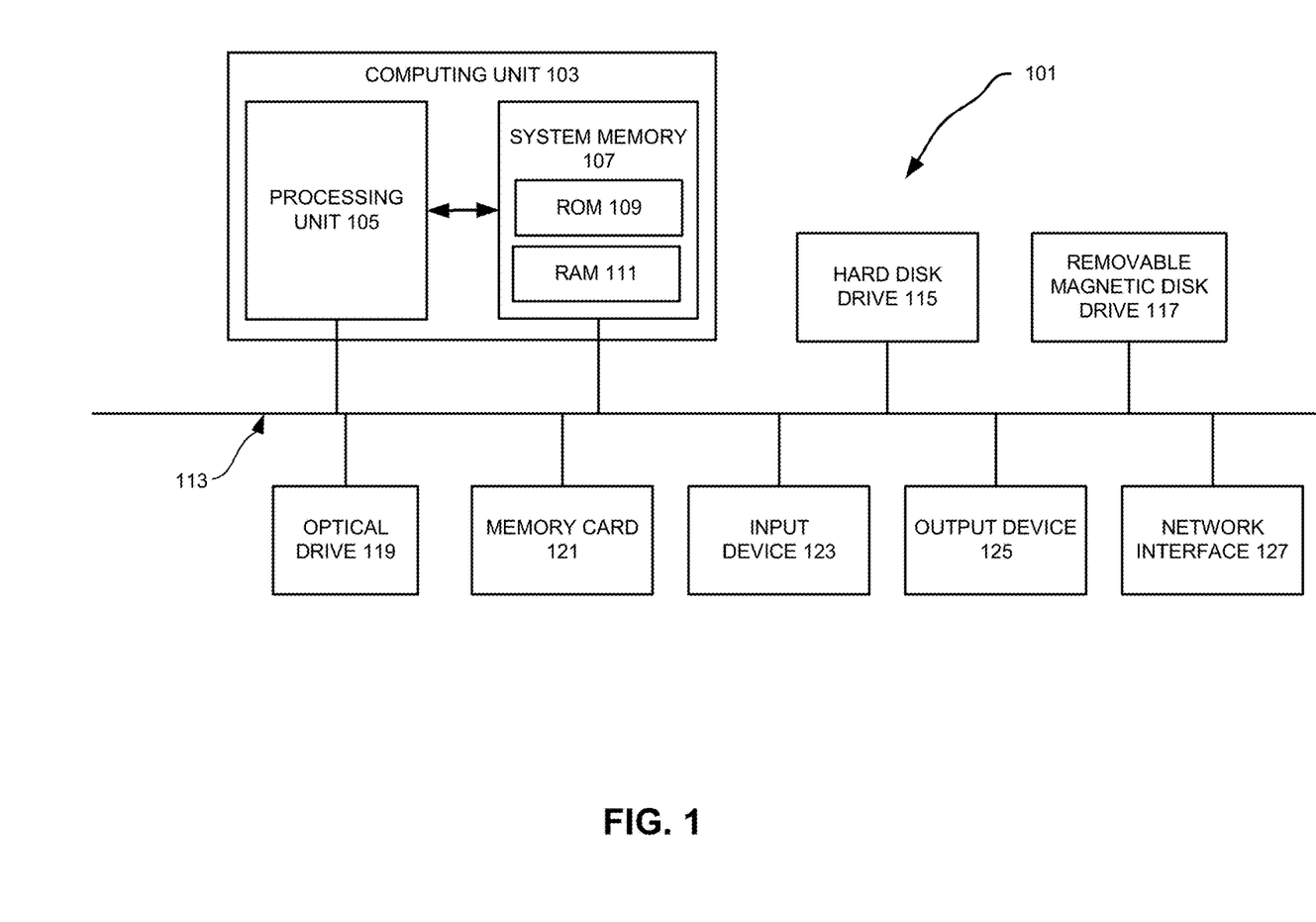
FIG. 1 illustrates a programmable computer system with which various embodiments of the disclosed technology may be employed.

Various examples of the disclosed technology may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but it will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it is not intended to be limiting. Various embodiments of the disclosed technology may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the disclosed technology may be implemented using a multi-processor computer, a plurality of single and/or multiprocessor computers arranged into a network, or some combination of both.

Design For Test, Test Pattern Generation, Testing And Diagnosis

The reduction in feature size increases the probability that a manufacture defect in the integrated circuit will result in a faulty chip. A very small defect can result in a faulty transistor or interconnecting wire. Even a single faulty transistor or wire can cause the entire chip to function improperly. Manufacture defects are unavoidable nonetheless, no matter whether the manufacturing process is at the prototype stage or the high-volume manufacturing stage. It is thus necessary to test chips during the manufacturing process. Diagnosing faulty chips is also needed to ramp up and to maintain the manufacturing yield.

Testing typically includes applying a set of test stimuli (test patterns) to the circuit-under-test and then analyzing responses generated by the circuit-under-test. Functional testing attempts to validate that the circuit-under-test operates according to its functional specification while structural testing tries to ascertain that the circuit-under-test has been assembled correctly from some low-level building blocks as specified in a structural netlist and that these low-level building blocks and their wiring connections have been manufactured without defect. For structural testing, it is assumed that if functional verification has shown the correctness of the netlist and structural testing has confirmed the correct assembly of the structural circuit elements, then the circuit should function correctly. Structural testing has been widely adopted at least in part because it enables the test (test pattern) generation to focus on testing a limited number of relatively simple circuit elements rather than having to deal with an exponentially exploding multiplicity of functional states and state transitions.

To make it easier to develop and apply test patterns, certain testability features are added to circuit designs, which is referred to as design for test or design for testability (DFT). Scan testing is the most common DFT method. In a basic scan testing scheme, all or most of internal sequential state elements (latches, flip-flops, et al.) in a circuit design are made controllable and observable via a serial interface. These functional state elements are usually replaced with dual-purpose state elements called scan cells. Scan cells are connected together to form scan chains—serial shift registers for shifting in test patterns and shifting out test responses. A scan cell can operate as originally intended for functional purposes (functional/mission mode) and as a unit in a scan chain for scan (scan mode). A widely used type of scan cell include an edge-trigged flip-flop with two-way multiplexer for the data input. The two-way multiplexer is typically controlled by a single control signal called scan_enable, which selects the input signal for a scan cell from either a scan signal input port or a system signal input port. The scan signal input port is typically connected to an output of another scan cell while the system signal input port is connected to the functional logic. Scan cells can serve as both a control point and an observation point. Control points can be used to set certain logic values at some locations of the circuit-under-test, exciting (activating) a fault and propagating the incorrect value to an observation point. Scan testing allows the test equipment to access gates deeply embedded through the primary inputs/outputs and/or some physical test points and can remove the need for complicated state transition sequences when trying to control or observe what is happening at some internal circuit element.

Scan cells and related clocking circuitry can take up about 30% of silicon area of an integrated circuit chip. It has been reported that scan chain failures account for almost 50% of chip failure in some cases. Scan chain defect diagnosis is thus important to guide physical failure analysis and yield learning process. In a scan chain testing and defect diagnosis process, a special type of test patterns, often referred to as chain (test) patterns or flush (test) patterns, is typically used. A chain pattern is a test pattern used in a process comprising shift-in and shift-out without pulsing capture clocks. By comparing the chain patterns shifted out with the original ones, faulty scan chains (or defective scan chains) and fault models may be identified. For example, if a scan cell on a scan chain has a stuck-at-zero fault, a chain pattern of "11 ... 1" will be changed to "00 ... 0" after being unloaded from the scan chain.

Scan chain fault models may be classified into nine categories: slow-to-rise, slow-to-fall, slow, fast-to-rise, fast-to-fall, fast, stuck-at-0, stuck-at-1, and indeterminate faults. Faults in the first three categories are caused by setup-time violations while those in the next three categories are caused by hold-time violations. A scan chain defect can also be modeled as a permanent fault (the fault that happens for all shift cycles) or an intermittent fault (the fault that happens only for a subset of shift cycles). Note that the defect itself is still permanent, but the fault model used to represent the defect is intermittent. For example, an intermittent stuck-at-0 fault refers to a defect that can cause some shift operations to fail as if a stuck-at-0 fault intermittently appears while which shift cycles may fail is not known.

As mentioned previously, a reconfigurable scan network can form different scan paths at different times based on the configuration data stored in the programmable components. If a configured scan path does not work as expected, the failure may be caused by a defective register bit or a defective programmable component. Each of the formed scan paths operates like a regular scan chain. Thus, conventional chain patterns can be used for testing and diagnosing bits of the shift registers in a reconfigurable scan network. Programmable components of a reconfigurable scan network such as SIBs and ScanMuxes in an IJTAG network, however, cannot be diagnosed using conventional techniques.

Diagnosing Defective Programmable Elements

Figure 3:
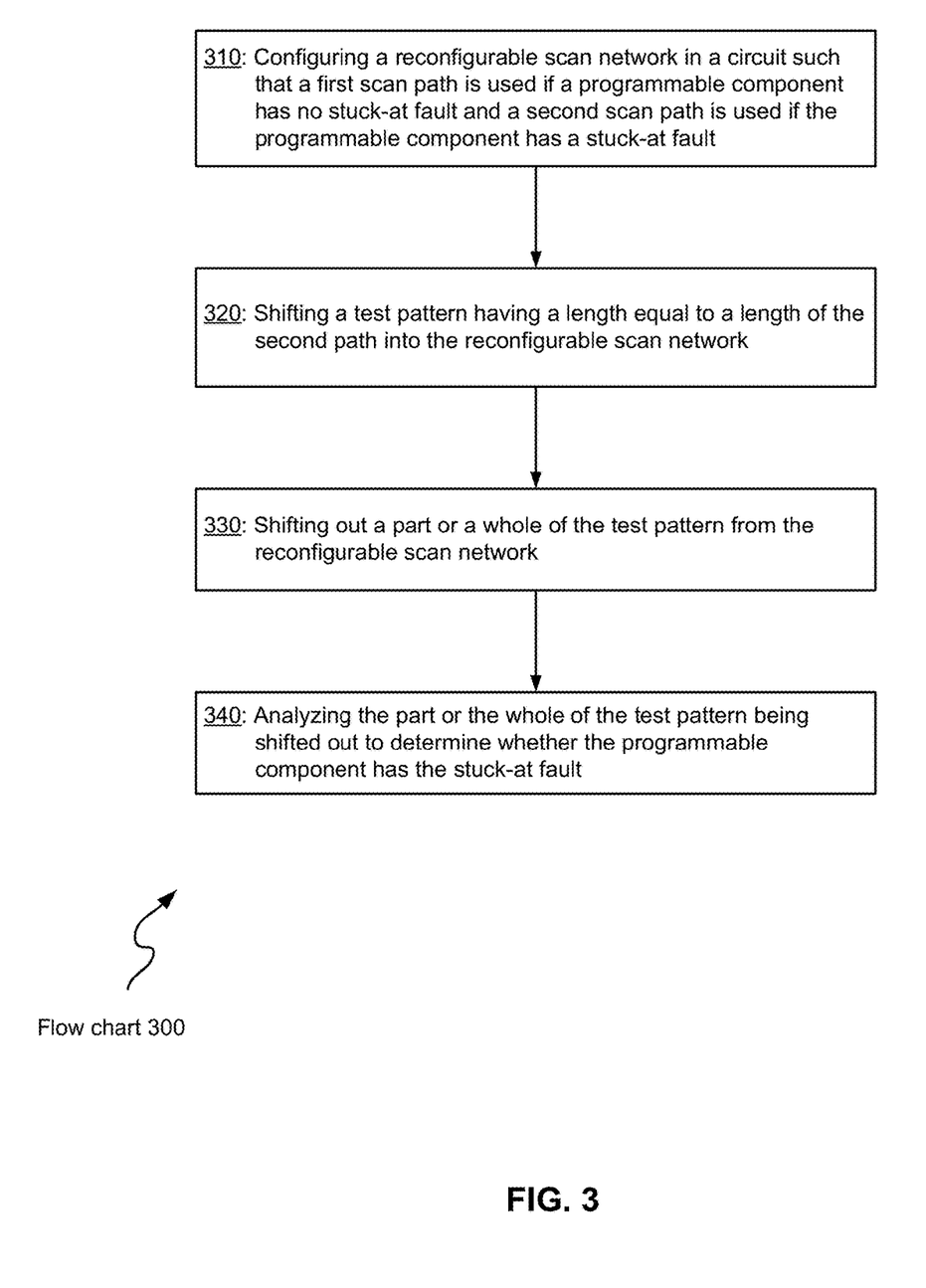
FIG. 3 illustrates a flowchart showing a process for diagnosing defective programmable components of a reconfigurable scan network that may be implemented according to various examples of the disclosed technology.

FIG. 3 illustrates a flowchart 300 showing a process for diagnosing defective programmable components of a reconfigurable scan network that may be implemented according to various examples of the disclosed technology. For ease of understanding, methods for diagnosing defective programmable components of a reconfigurable scan network that may be employed according to various embodiments of the disclosed technology will be described with reference to the reconfigurable scan network 200 illustrated in FIG. 2 and the flow chart 300 in FIG. 3. It should be appreciated, however, that the reconfigurable scan network 200 illustrated in FIG. 2 is just an example. The method for diagnosing defective programmable components of a reconfigurable scan network illustrated in the flow chart 300 can be applied to different IJTAG networks or reconfigurable scan networks not conforming to IEEE 1687-2014. In addition, it should be appreciated that methods for diagnosing defective programmable components of a reconfigurable scan network according to different embodiments of the disclosed technology may not be exactly the same one as illustrated by the flow chart 300 in FIG. 3.

In operation 310, a reconfigurable scan network in a circuit is configured such that a first scan path is used if a programmable component has no stuck-at fault and a second scan path is used if the programmable component has a stuck-at fault. The first scan path and the second scan path share a same scan path segment after the programmable component. The programmable component may be determined to be a suspect for having the stuck-at fault based on a test performed on the reconfigurable scan network. If the test response from a particular scan path is not the same as the good-machine response, this particular scan path may be defective. A defective scan path may also be identified if a functional block is found to have some problems of receiving correct data from a test data register on the scan path. On a defective scan path, some or all of the components may be defect suspects, causing the scan path to be defective. In FIG. 2, assume that the scan path TDI 251—TDR231—TDR 232—TDR 233—SanMux 240—SIB 222—SIB221—SIB 223—TDO217 is defective. Then some or all of the above components (TDR231, 232 and 233, SIB 221, 222 and 223, and ScanMux 240) may be defect suspects.

To determine whether the SIB 221 has a stuck-at-zero fault (always in the de-asserted state), two scan paths passing through the SIB 221 (the first scan path and the second scan path) are selected and configured. Typically, a large number of different scan paths can pass through a specific programmable component. In the simple example shown in FIG. 2, eight different scan paths pass through the SIB 221:

1) TDI 251—SIB221—SIB 223—TDO217;
2) TDI 251—SIB221—TDR 235—TDR 236—SIB 223—TDO217;
3) TDI 251—TDR231—SIB 222—SIB221—SIB 223—TDO217;
4) TDI 251—TDR231—SIB 222—SIB221—TDR 235—TDR 236—SIB 223—TDO217;
5) TDI 251—TDR231—TDR 232—TDR 233—SanMux 240—SIB 222—SIB221—SIB 223—TDO217;
6) TDI 251—TDR231—TDR 232—TDR 233—SanMux 240—SIB 222—SIB221—TDR 235—TDR 236—SIB 223—TDO217;
7) TDI 251—TDR231—TDR 232—TDR 234—SanMux 240—SIB 222—SIB221—SIB 223—TDO217; and
8) TDI 251—TDR231—TDR 232—TDR 234—SanMux 240—SIB 222—SIB221—TDR 235—TDR 236—SIB 223—TDO217.

Among them, the scan path #5 is the assumed defective scan path. If the SIB 221 has a stuck-at-zero fault, then only the scan paths #1 and #2 can be used. Because the first scan path and the second scan path need to share the same scan path segment after the SIB221, they can be choose from the six pairs of scan paths: the scan path #1 with one of the scan paths #3, #5 and #7, and the scan path #2 with one of the scan paths #2, #4 and #8.

In some embodiments of the disclosed technology, the first scan path and the second scan path are selected such that the scan path segment shared by them has a minimum length. This shortens the time needed for the subsequent operations. In the above example, the second scan path will be the scan path #1 and the first scan path can be choose from the scan paths #3, #5 and #7. To further reduce the test time, the first scan path and the second scan path may be chosen to have the shortest lengths. In the above example, the second scan path will be the scan path #1 and the first scan path will be the scan path #3. In this case, configuration data intended to assert the SIB 221 and to de-assert the SIB 222 and the SIB 223 may be shifted into the reconfigurable scan network 200 for the operation 310. To configure the reconfigurable scan path for shorter scan path, a SIB is typically programmed to be in the de-asserted state and a ScanMux is typically programmed to select the shortest scan segment as its input.

Figure 4A:
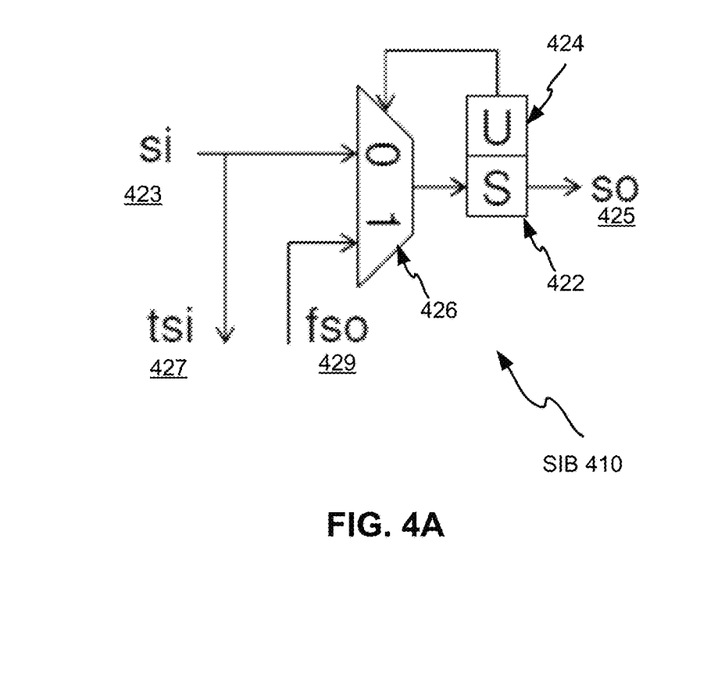
FIG. 4A illustrates a simplified schematic diagram of a possible implementation of a SIB.

FIG. 4A illustrates a simplified schematic diagram of a possible implementation of a SIB 410. The SIB 410 comprises a one-bit shift-update register (422+424) and a two-input multiplexer 426. The one-bit shift-update register comprises an S flip flop 422 and a parallel U latch 424. The SIB 410 can be programmed by shifting a bit into the S flip flop 422 and latching that bit into the parallel U latch 424. If the latched bit is 0, the SIB 410 is in a de-asserted state (or being de-asserted) and the scan-path is from the si (ScanIn) terminal 423 to the so (ScanOut) terminal 425 via the S flip-flop 422, bypassing the segment between the tsi (ToScanIn) terminal 427 and the fso (FromScanOut) terminal 429. If, on the other hand, the latched bit is 1, the SIB 410 is in an asserted state (or being asserted) and the scan-path includes the segment connected between tsi (427) and fso (429) terminals of the SIB 410.

Figure 4B:
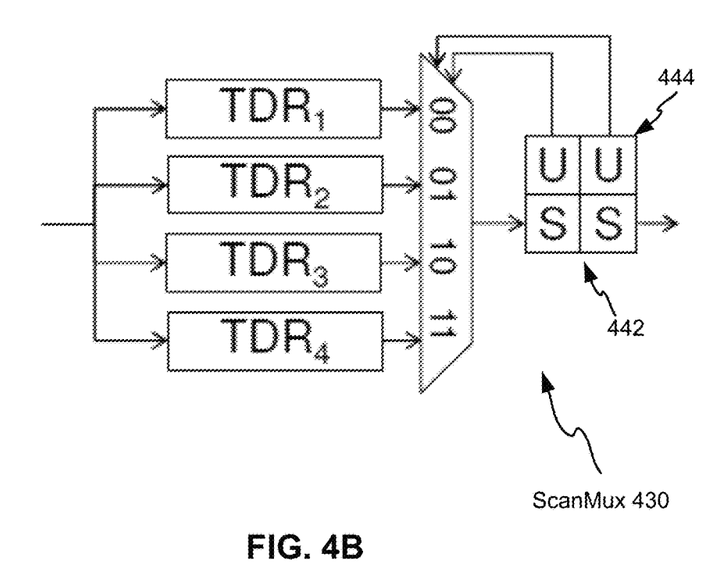
FIG. 4B illustrates a simplified schematic diagram of a possible implementation of a 4-to-1 ScanMux.

FIG. 4B illustrates a simplified schematic diagram of a possible implementation of a 4-to-1 ScanMux 430. The ScanMux 430 is programed by shifting the required values into the shift flip-flops 442 of the control register (i.e., the S flip-flops) and latching the shifted bits into the parallel U latches 444. There are four scan segments, from which the ScanMux 430 can select as the input. Each of the four scan segments has a test data register. It should be appreciated by person of ordinary skill in the art that the clock, reset, the control signals (namely, shift, update, and capture), and the select signal needed to gate the control signals are not shown in FIGS. 4A and 4B. It should also be appreciated by person of ordinary skill in the art that programmable components other than the SIB and the ScanMux described here can be employed to achieve reconfigurability.

Refer back to the flowchart 300. In operation 320, a test pattern having a length equal to a length of the second path is shifted into the reconfigurable scan network. The test pattern may be a particular sequence of zeros and ones, which is distinguishable from random sequences or sequences generated by the chain faults. In operation 330, a part or a whole of the test pattern is shifted out from the reconfigurable scan network. This can be accomplished by shifting a dummy pattern such as a pattern with each bit being a zero. Alternatively, it may be accomplished by shifting in another test pattern for performing another test.

In operation 340, the part or the whole of the test pattern being shifted out is analyzed to determine whether the programmable component has the stuck-at fault. The bits shifted out from the reconfigurable scan network can be compared with the bits of the original test pattern to determine whether and when the part or the whole of the test pattern is shifted out. If the part or the whole of the test pattern is shifted out at the clock cycles expected for the second scan path, then the programmable component has the stuck-at fault. The disclosed technology is applicable to cases where the programmable component is a SIB because the first scan path and the second scan path will have different scan lengths and where the programmable component is a ScanMux and the scan segments selected by the ScanMux have different scan lengths.

The operations 310-340 can be performed by a tester. Automatic test equipment (ATE) is usually employed to apply test patterns to manufactured circuits and to collect the test responses. A bench-top tester based on a computer system such as the one shown in FIG. 1 plus an interface to the circuit-under-test and test software can also be employed to perform the operations 310-330. For example, Tessent® SiliconInsight®, commercially available from Mentor Graphics Corporation, Wilsonviile, Oreg., can be used to build a bench-top tester to conduct the reconfigurable scan network defect diagnosis according to various embodiments of the disclosed technology.

Figure 5:
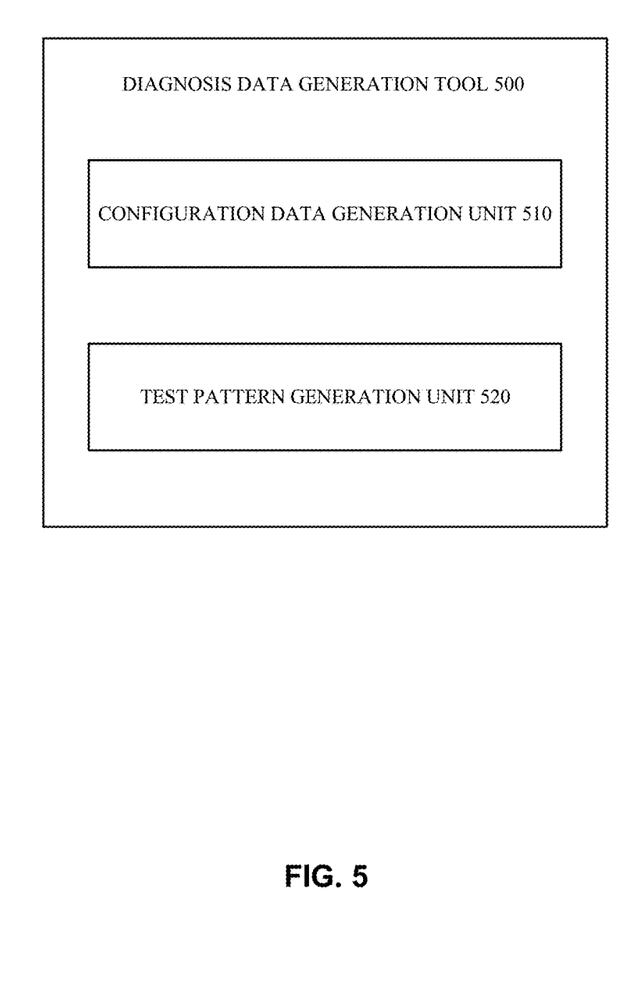
FIG. 5 illustrates an example of a diagnosis data generation tool according to various embodiments of the disclosed technology

The disclosed technology can also be implemented by one or more computing systems, such as the computing system illustrated in FIG. 1. FIG. 5 illustrates an example of a diagnosis data generation tool 500 that may be implemented according to various embodiments of the disclosed technology. As seen in this figure, the diagnosis data generation tool 500 includes a configuration data generation unit 510 and a test pattern generation unit 520. The configuration data generation unit 510 generates configuration data which can be used to configure a reconfigurable scan network in a circuit such that a first scan path is used if a programmable component has no stuck-at fault and a second scan path is used if the programmable component has a stuck-at fault. Here, the first scan path and the second scan path share a same scan path segment after the programmable component. The test pattern generation unit 520 generates a test pattern having a length equal to a length of the second path for being shifting into and out from the reconfigurable scan network configured by the configuration data. A part or a whole of the test pattern being shifted out can be analyzed to determine whether the programmable component has the stuck-at fault. The analysis includes determining whether the part or the whole of the test pattern is shifted out at clock cycles expected for the second scan path.

As noted above, various examples of the disclosed technology may be implemented by one or more computing systems, such as the computing system illustrated in FIG. 1. Accordingly, one or both of the configuration data generation unit 510 and the test pattern generation unit 520 may be implemented by executing programming instructions on one or more processors in one or more computing systems, such as the computing system illustrated in FIG. 1. Correspondingly, some other embodiments of the disclosed technology may be implemented by software instructions, stored on a non-transitory computer-readable medium, for instructing one or more programmable computers/computer systems to perform the functions of one or both of the configuration data generation unit 510 and the test pattern generation unit 520. As used herein, the term "non-transitory computer-readable medium" refers to computer-readable medium that are capable of storing data for future retrieval and not propagating electro-magnetic waves. The non-transitory computer-readable medium may be, for example, a magnetic storage device, an optical storage device, or a solid state storage device.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. A method, comprising:
configuring a reconfigurable scan network in a circuit such that a first scan path is used if a programmable component has no stuck-at fault and a second scan path is used if the programmable component has a stuck-at fault, the first scan path and the second scan path sharing a same scan path segment after the programmable component;
shifting a test pattern having a length equal to a length of the second path into the reconfigurable scan network;
shifting out a part or a whole of the test pattern from the reconfigurable scan network; and
analyzing the part or the whole of the test pattern being shifted out to determine whether the programmable component has the stuck-at fault, the analyzing comprises: determining whether the part or the whole of the test pattern is shifted out at clock cycles expected for the second scan path.

2. The method recited in claim 1, wherein the reconfigurable scan network conforms to IEEE 1687-2014 (IJTAG).

3. The method recited in claim 2, wherein the programmable component defect suspect is a SIB or a ScanMux.

4. The method recited in claim 1, wherein the first scan path and the second scan path are selected such that the same scan path segment after the programmable component has a shortest length.

5. The method recited in claim 1, wherein programmable components of the reconfigurable scan network other than the programmable component defect suspect are programmed to allow a shorter scan path segment to be selected for each of the programmable components.

6. One or more non-transitory computer-readable media storing computer-executable instructions for causing one or more processors to perform a method, the method comprising:
generating configuration data for configuring a reconfigurable scan network in a circuit such that a first scan path is used if a programmable component has no stuck-at fault and a second scan path is used if the programmable component has a stuck-at fault, the first scan path and the second scan path sharing a same scan path segment after the programmable component; and
generating a test pattern having a length equal to a length of the second path for being shifting into and out from the reconfigurable scan network configured by the configuration data, wherein a part or a whole of the test pattern being shifted out is analyzed to determine whether the programmable component has the stuck-at fault, the analyzing comprises: determining whether the part or the whole of the test pattern is shifted out at clock cycles expected for the second scan path.

7. The one or more non-transitory computer-readable media recited in claim 6, wherein the reconfigurable scan network conforms to IEEE 1687-2014 (IJTAG).

8. The one or more non-transitory computer-readable media recited in claim 7, wherein the programmable component defect suspect is a SIB or a ScanMux.

9. The one or more non-transitory computer-readable media recited in claim 6, wherein the first scan path and the second scan path are selected such that the same scan path segment after the programmable component has a shortest length.

10. The one or more non-transitory computer-readable media recited in claim 6, wherein programmable components of the reconfigurable scan network other than the programmable component defect suspect are programmed to allow a shorter scan path segment to be selected for each of the programmable components.

11. A method, executed by at least one processor of a computer, comprising:
generating configuration data for configuring a reconfigurable scan network in a circuit such that a first scan path is used if a programmable component has no stuck-at fault and a second scan path is used if the programmable component has a stuck-at fault, the first scan path and the second scan path sharing a same scan path segment after the programmable component; and
generating a test pattern having a length equal to a length of the second path for being shifting into and out from the reconfigurable scan network configured by the configuration data, wherein a part or a whole of the test pattern being shifted out is analyzed to determine whether the programmable component has the stuck-at fault, the analyzing comprises: determining whether the part or the whole of the test pattern is shifted out at clock cycles expected for the second scan path.

12. The method recited in claim 11, wherein the reconfigurable scan network conforms to IEEE 1687-2014 (IJTAG).

13. The method recited in claim 12, wherein the programmable component defect suspect is a SIB or a ScanMux.

14. The method recited in claim 11, wherein the first scan path and the second scan path are selected such that the same scan path segment after the programmable component has a shortest length.

15. The method recited in claim 11, wherein programmable components of the reconfigurable scan network other than the programmable component defect suspect are programmed to allow a shorter scan path segment to be selected for each of the programmable components.

* * * * *